(12) United States Patent
Redaelli (10) Patent No.: US 12,124,717 B2
(45) Date of Patent: Oct. 22, 2024

(54) HOST-INITIATED AND AUTO-INITIATED NON-VOLATILE MEMORY REFRESH

(71) Applicant: Micron Technology, Inc., Boise, ID (US)

(72) Inventor: Marco Redaelli, Munich (DE)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 17/897,940

(22) Filed: Aug. 29, 2022

(65) Prior Publication Data

US 2024/0069768 A1 Feb. 29, 2024

(51) Int. Cl.
*G06F 12/00* (2006.01)
*G06F 3/06* (2006.01)

(52) U.S. Cl.
CPC .......... *G06F 3/0632* (2013.01); *G06F 3/0619* (2013.01); *G06F 3/0659* (2013.01); *G06F 3/0679* (2013.01)

(58) Field of Classification Search
CPC .... G06F 3/0632; G06F 3/0619; G06F 3/0659; G06F 3/0679
USPC ........................................................ 711/166
See application file for complete search history.

(56) References Cited

U.S. PATENT DOCUMENTS

| | | | |
|---|---|---|---|
| 10,665,287 B2 * | 5/2020 | Lim | G11C 11/4074 |
| 2005/0259493 A1 * | 11/2005 | Walker | G11C 11/406 365/222 |
| 2018/0096719 A1 * | 4/2018 | Tomishima | G11C 29/48 |
| 2020/0258565 A1 * | 8/2020 | Schaefer | G11C 11/2275 |

* cited by examiner

*Primary Examiner* — Mardochee Chery
(74) *Attorney, Agent, or Firm* — Schwegman Lundberg & Woessner, P.A.

(57) ABSTRACT

A memory device controller for a non-volatile memory device can be configured to allow exclusive access to initiate or increment a refresh routine based on an earlier-received one of a refresh command from a host device or an interval-triggered refresh command from the controller. The memory device controller can be configured to lock out access to the refresh routine from a later-received one of the refresh command from the host device or the interval-triggered refresh command from the controller. The memory device controller can release a lock on access to the refresh routine upon completion of a block refresh routine for a memory block of the memory device. In some examples, the refresh command from the host device can be based on a power cycle status of the host device.

23 Claims, 6 Drawing Sheets

HOST-INITIATED AND AUTO-INITIATED NON-VOLATILE MEMORY REFRESH

BACKGROUND

A variety of computer systems and electronic devices use memory that is not volatile. In other words, the memory does not lose stored data when power is disconnected. These non-volatile memories (NVM) can be reprogrammed, read, and erased electronically, and are well-suited to store a variety of data. Such memory includes devices commonly known as flash memory, named in part because a flash operation is used to erase the content of a block of memory cells before it is reprogrammed. This type of memory is often packaged for consumer use in products such as memory cards, USB flash memory drives, and other devices.

Flash memory typically comprises a number of cells, each programmable to one of at least two data states, where each data state can represent a data value such as a digit (e.g, a bit) or digits of data. A typical flash memory cell comprises a field effect transistor having an electrically isolated charge storage structure such as a floating gate or charge trap that controls electrical conduction between source and drain regions of the memory cell. Data is represented by a charge stored on the charge storage structure, and the resulting change in conductivity observed between the source and drain regions.

The charge storage structure separates a control gate from the source and drain regions of the memory cell. Electrons stored on the charge storage structure are electrically insulated from the control gate and the drain and source by a dielectric material, such as a tunnel oxide. When the memory cell is read by placing a specified voltage on the control gate, the electrical impedance between the source and drain of the device will either allow or not allow current to flow, depending on the effective threshold voltage (Vt) of the memory cell. The stored charge partially cancels out or modifies an electric field produced by the control gate, resulting in a change in the effective threshold voltage (Vt) of the memory cell. The presence or absence of current in response to a particular voltage applied to the control gate can be sensed and used to determine whether the memory cell is in a particular data state representing a particular data value, such as a one or zero value.

Some flash memory cells can be programmed to one of three or more data states, and are often referred to as multi-level memory cells. For example, a multi-level memory cell that can be programmed to any of four states can store two bits of data per cell, thereby doubling the amount of data that can be stored relative to a conventional single-bit memory cell.

Memory cells are typically arranged in a two-dimensional array of rows and columns, where the memory cells in a row are coupled via an access line, often called a wordline, and the memory cells in a column are coupled to a data line, often called a bitline. The wordlines and bitlines are used during data read and program functions to either select certain memory cells for reading or to select certain memory cells for programming (which is sometimes referred to as "writing").

Memory cells are susceptible to a variety of factors that can influence accuracy of stored data, such as magnetic fields, cosmic rays, read-induced interference, and other factors that can alter the charge stored on the charge storage structure of a flash memory cell. Induced electric or magnetic fields, capacitive coupling, and finite resistance of the conductors and insulators can also cause unwanted coupling or interference between bitlines and wordlines. Any of these factors can reduce the accuracy of reading a memory cell. Factors such as these can be even more significant in multi-level memories having more than two possible data states per memory cell, as the difference between adjacent data states becomes more difficult to accurately discern as the number of possible data states increases.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
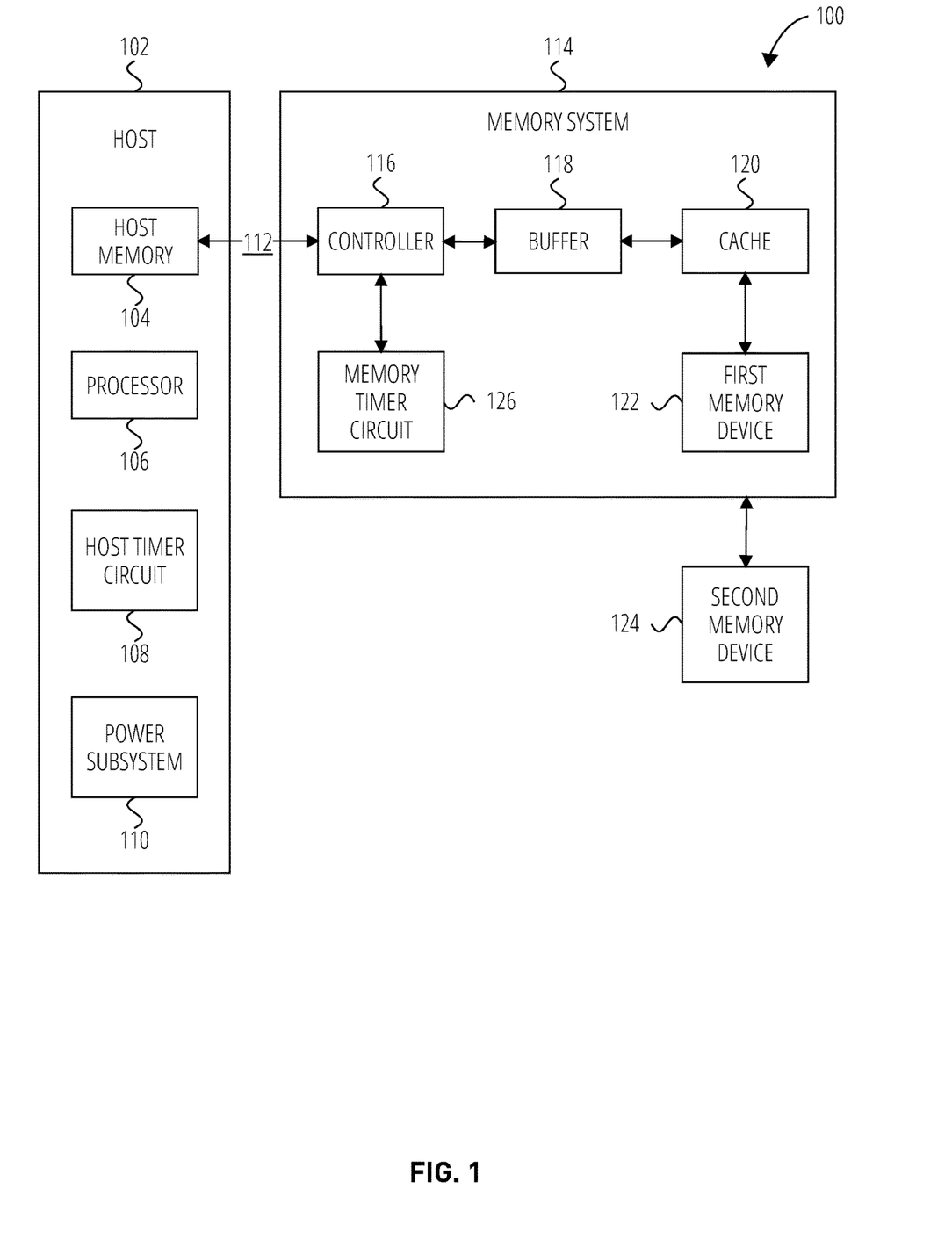
FIG. 1 illustrates generally a block diagram of an example of a computing system including a host device and a memory system.

FIG. 1 illustrates generally a block diagram of an example of a computing system 100 including a host device 102 and a memory system 114. The host device 102 includes a central processing unit (CPU) or processor 106 and a host memory 104. In an example, the host device 102 can include a host system such as a personal computer, a desktop computer, a digital camera, a smart phone, a memory card reader, and/or Internet-of-things enabled device, among various other types of hosts, and can include a memory access device, e.g., the processor 106. The processor 106 can include one or more processor cores, a system of parallel processors, or other CPU arrangement.

In an example, the host device 102 includes a host timer circuit 108 and a power subsystem 110. The host timer circuit 108 can be configured to measure various time intervals. For example, the host timer circuit 108 can measure time intervals between refresh commands provided to the memory system 114. In an example, the host timer circuit 108 can measure a time interval since a last refresh command was provided to the memory system 114, or a time interval since the memory system 114 last provided an indication (e.g., to the host device 102) that a refresh operation was performed by the memory system 114 or another memory device. The host timer circuit 108 can receive a timer control signal that indicates the interval or period to use between issued refresh commands.

In an example, the power subsystem 110 includes a system or circuit that controls or monitors power for a device or system that includes or uses the host device 102. For example, the power subsystem 110 can be a controller for an industrial or automotive power system that controls a motor or one or more accessories. In an example, the power subsystem 110 is configured to manage power cycles including power-up and power-down routines for one or more components of the device or system that includes or uses the host device 102. In an example, the power subsystem 110 manages or coordinates power storage or generator components, sensor signals (e.g., from temperature sensors, acceleration sensors, timers such as the host timer circuit 108), computers, peripherals, or other devices or systems.

In an example, the power subsystem 110 is configured to receive a power system control command (e.g., from a different system controller, from a user interface, or from a different source) and, in response, coordinate a power-up or power-down routine. A power-down routine can include a sequence of timed operations that can allow time, for example, to gather state information about the host device 102, save various information from volatile memory in non-volatile memory, or verify a validity of particular data, before removing power from particular components. A power-up routine can include a sequence of timed operations that can allow time for particular primary components to reach a specified level of functionality before other secondary components, which may depend on one or more primary components, attempt to operate.

In the example of FIG. 1, the memory system 114 includes a controller 116, a buffer 118, a cache 120, a memory timer circuit 126, and a first memory device 122. The first memory device 122 can include, for example, one or more memory modules (e.g., single in-line memory modules, dual in-line memory modules, etc.). The first memory device 122 can include volatile memory and/or non-volatile memory, and can include a multiple-chip device that comprises one or multiple different memory types or modules. In an example, the computing system 100 includes a second memory device 124 that interfaces with the memory system 114 and the host device 102.

The host device 102 can include a system backplane and can include a number of processing resources (e.g., one or more processors, microprocessors, or some other type of controlling circuitry). The computing system 100 can optionally include separate integrated circuits for the host device 102, the memory system 114, the controller 116, the buffer 118, the cache 120, the first memory device 122, the second memory device 124, any one or more of which may comprise respective chiplets that can be connected and used together. In an example, the computing system 100 includes a server system and/or a high-performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

In an example, the first memory device 122 can provide a main memory for the computing system 100, or the first memory device 122 can comprise accessory memory or storage for use by the computing system 100. In an example, the first memory device 122 or the second memory device 124 includes one or more arrays of memory cells, e.g., volatile and/or non-volatile memory cells. The arrays can be flash arrays with a NAND architecture, for example. Embodiments are not limited to a particular type of memory device. For instance, the memory devices can include RAM, ROM, DRAM, SDRAM, PCRAM, RRAM, and flash memory, among others.

In embodiments in which the first memory device 122 includes persistent or non-volatile memory, the first memory device 122 can include a flash memory device such as a NAND or NOR flash memory device. The first memory device 122 can include other non-volatile memory devices such as non-volatile random-access memory devices (e.g., NVRAM, ReRAM, FeRAM, MRAM, PCM), memory devices such as a ferroelectric RAM device that includes ferroelectric capacitors that can exhibit hysteresis characteristics, a 3-D Crosspoint (3D XP) memory device, etc., or combinations thereof.

In an example, the controller 116 comprises a media controller such as a non-volatile memory express (NVMe) controller. The controller 116 can be configured to perform operations such as copy, write, read, error correct, etc. for the first memory device 122. In an example, the controller 116 can include purpose-built circuitry and/or instructions to perform various operations. That is, in some embodiments, the controller 116 can include circuitry and/or can be configured to perform instructions to control movement of data and/or addresses associated with data such as among the buffer 118, the cache 120, and/or the first memory device 122 or the second memory device 124.

In an example, at least one of the processor 106 and the controller 116 comprises a command manager (CM) for the memory system 114. The CM can receive, such as from the host device 102, a read command for a particular logic row address in the first memory device 122 or the second memory device 124. In some examples, the CM can determine that the logical row address is associated with a first row based at least in part on a pointer stored in a register of the controller 116. In an example, the CM can receive, from the host device 102, a write command for a logical row address, and the write command can be associated with second data. In some examples, the CM can be configured to issue, to non-volatile memory and between issuing the read command and the write command, an access command associated with the first memory device 122 or the second memory device 124. In some examples, the CM can issue, to the non-volatile memory and between issuing the read command and the write command, an access command associated with the first memory device 122 or the second memory device 124.

In an example, the controller 116 is coupled to the memory timer circuit 126. The memory timer circuit 126 can be configured to measure various time intervals. For example, the memory timer circuit 126 can measure time intervals between refresh operations performed by or using the memory system 114 or a component of the memory system 114. In an example, the memory timer circuit 126 can measure a time interval since a last refresh command was received by the memory system 114, or a time interval since the memory system 114 last provided an indication (e.g., to the host device 102) that a refresh operation was performed by the memory system 114 or another memory device. The memory timer circuit 126 can receive a timer control signal (e.g., from the host device 102) that indicates the interval or period to use between issued refresh commands.

In an example, the buffer 118 comprises a data buffer circuit that includes a region of a physical memory used to temporarily store data, for example, while the data is moved from one place to another. The buffer 118 can include a first-in, first-out (FIFO) buffer in which the oldest (e.g., the first-in) data is processed first. In some embodiments, the buffer 118 includes a hardware shift register, a circular buffer, or a list.

In an example, the cache 120 comprises a region of a physical memory used to temporarily store particular data that is likely to be used again. The cache 120 can include a pool of data entries. In some examples, the cache 120 can be configured to operate according to a write-back policy in which data is written to the cache without the being concurrently written to the first memory device 122. Accordingly, in some embodiments, data written to the cache 120 may not have a corresponding data entry in the first memory device 122.

In an example, the controller 116 can receive write requests (e.g., from the host device 102) involving the cache 120 and cause data associated with each of the write requests to be written to the cache 120. In some examples, the controller 116 can receive the write requests at a rate of thirty-two (32) gigatransfers (GT) per second, such as according to or using a CXL protocol. The controller 116 can similarly receive read requests and cause data stored in, e.g., the first memory device 122 or the second memory device 124, to be retrieved and written to, for example, the host device 102 via an interface 112.

In an example, the interface 112 can include any type of communication path, bus, or the like that allows information to be transferred between the host device 102 and the memory system 114. Non-limiting examples of interfaces can include a peripheral component interconnect (PCI) interface, a peripheral component interconnect express (PCIe) interface, a serial advanced technology attachment (SATA) interface, and/or a miniature serial advanced technology attachment (mSATA) interface, among others. In an example, the interface 112 includes a PCIe 5.0 interface that is compliant with the compute express link (CXL) protocol standard. Accordingly, in some embodiments, the interface 112 supports transfer speeds of at least 32 GT/s.

In an example, the memory system 114 includes an array of non-volatile memory cells that comprise the first memory device 122, the second memory device 124, or other memory device. In some examples, the memory cells are arranged in blocks of multiple cells. The controller 116 of the memory system 114 comprises a memory controller that can be configured to refresh at least a portion of the memory cells in response to a refresh command. The refresh command can be based on an automatic refresh cadence or a host command. For example, the refresh command can be based on an interval (such as can be fixed or variable) that is measured by the memory timer circuit 126. In an example, the refresh command can be based on a command received via the interface 112 from the host device 102.

In an example, the controller 116 can refresh the portion of the memory cells in coordination with, or in response to, checking the memory cells for one or more errors. The errors can include, for example, a change in an operating margin of a stored cell voltage. As further explained below, the controller 116 can be configured to execute a refresh routine that includes copying at least one memory block (e.g., comprising multiple cells) to a known-good memory block.

In an example, the controller 116 can be configured to resolve conflicting refresh commands or instructions from the host device 102 and the refresh cadence of the memory system 114. For example, the controller 116 can exclusively allow initiation of a refresh routine based on one or the other of the host command and the automatic refresh cadence at any particular time. In other words, the controller 116 can be configured to allow exclusive access to initiate or increment a refresh routine based on an earlier-received one of a refresh command from the host device 102, or an interval-triggered refresh command from the controller 116, such as can be triggered based on the memory timer circuit 126. The controller 116 can be configured to use a mutex function or similar mechanism to control an influence of the automatic refresh cadence and the host command on the refresh routine. That is, the controller 116 can be configured to limit access to initiation or performance of a refresh routine.

In response to a host-initiated refresh command or an automatically-initiated host refresh command, the controller 116 of the memory system 114 can increment a refresh routine, or refresh scan, by one block or multiple blocks of memory cells. The controller 116, the memory system 114, or the host device 102 can maintain a log (e.g., a text file or other data file) indicating a refresh status for the blocks of memory cells. For example, the log can include a Self-Monitoring, Analysis and Reporting Technology (SMART) log that shows the status of a refresh of at least one of the memory devices of the memory system 114. For example, the SMART log can include information about an overall portion of a memory device that was refreshed within a specified time period. The information can be presented as an overall percentage of the device that has been refreshed, as a volume or quantity of data relative to a device capacity, or using other metrics.

In an example, the first memory device 122 or the second memory device 124 can comprise a non-volatile memory comprising an array of non-volatile memory cells. A non-volatile memory cell can include, for example, source and drain structures formed on a substrate such as a p-type semiconductor material. The source, drain, and substrate can be formed of silicon, with a dopant such as phosphorous, arsenic, or antimony to increase the electron concentration in the silicon or with a dopant such as boron, gallium, indium, or aluminum to increase the hole concentration. Dopants are typically added in small, controlled quantities to produce the desired hole or electron concentration in the semiconductor material, resulting in n-type material if a surplus of electrons are present, such as in the source and drain, and resulting in p-type material if an excess of holes are present, such as in the substrate material.

An insulator material such as silicon oxide ($SiO2$) can be used to form an insulating layer which can have embedded within it a charge storage structure such as a floating gate, such as can be fabricated from a conductor such as metal or conductive polysilicon, or a charge trap (e.g., formed from a nitride material). A control gate is similarly formed of a conductive material. The floating gate is not directly electrically coupled to another conductive element of the memory cell, but is "floating" in the insulating material. The floating gate is separated from the region of the p-type substrate material between the source and the drain by a thin (e.g., ten nanometer) portion of the insulating layer, such as a tunnel dielectric portion of the insulating layer (e.g., silicon dioxide ($SiO2$) and/or a combination of an oxide, a nitride, and an oxide (ONO)).

In operation, the charge storage structure can store a charge due to its electrical isolation from other components of the memory cell. Programming or erasing a charge on the charge storage structure can be performed via a tunneling process known as Fowler-Nordheim tunneling, in which electrons tunnel through the portion of dielectric material separating the charge storage structure from the substrate. The portion of the dielectric material or materials separating the charge storage structure from the substrate are conventionally referred to as the tunnel dielectric.

Most flash memory devices are categorized as either NOR flash or NAND flash, based on the arrangement of the memory cells or the circuitry used to perform read, program, and erase operations.

In one example of programming a memory cell in a NOR flash memory, the source can be grounded and a supply voltage such as six volts can be applied to the drain. In one embodiment, the drain voltage is applied via a bitline used to identify the memory cell to be programmed. A higher voltage such as 12 volts is also placed on the control gate of the memory cell, forcing an inversion region to form in the p-type substrate due to the attraction of electrons to the positively charged control gate. The voltage difference between the source and drain in combination with the inversion region in the p-type material result in significant electron flow between the source and drain through the p-type substrate's inversion region, such that the kinetic energy of the electrons and the electric field generated by the control gate voltage at result in Fowler-Nordheim tunneling of high-energy (also known as "hot") electrons across the tunnel dielectric and onto the charge storage structure. The charge storage structure thereby adopts a negative charge that counteracts any control gate positive charge's effect on the region of the substrate between the source and drain, raising the voltage that must be applied to the control gate via a wordline to result in conduction across an inversion region in the p-type substrate material. In other words, when the wordline's voltage is brought to a high voltage (such as five volts) during a read operation, the cell will not turn on due to the higher threshold voltage as a result of electrons stored on the charge storage structure during the program operation. The read voltage applied to the control gate is larger than the threshold voltage Vt of an erased memory cell, but not large enough to allow conduction across an inversion region in the substrate of a cell that has been programmed.

In one example of programming a memory cell in a NAND flash, the source and drain of a memory cell can be grounded, and the control gate can be brought to a voltage of perhaps 20 volts. This voltage is significantly higher than the 12 volt control gate voltage used to program the same memory cell using NOR flash methods, because a higher voltage makes up for the absence of "hot" electrons slowing between the source and drain of the memory cell.

In an example of erasing a memory cell using NOR flash memory circuitry, a similar tunneling of electrons can take place from the charge storage structure to the source of the memory cell. The source is in some embodiments more deeply diffused than the drain to enhance erase performance. A positive voltage (such as twelve volts) can be applied to the source, the control gate can be grounded, and the drain can be left disconnected to perform an erase operation in one example. The large positive voltage on the source attracts negatively charged electrons causing them to tunnel through the insulating layer and leave the floating gate. Because there is little current flow between the source and drain during an erase operation, performing an erase operation takes little current and consumes relatively little power.

In another example memory cell erase operation in NAND memory, the source and drain can be left floating, but the substrate material is brought to a high positive voltage (such as 20 volts), attracting the negatively charged electrons and causing them to tunnel from the charge storage structure through the oxide insulating layer to the substrate material. This method is sometimes known as "channel erase" because the channel region in the substrate material receives electrons from the charge storage structure.

Memory cells can be arranged in arrays that are addressed via access lines known as wordlines, and data lines known as bitlines. For example, a portion of a NAND flash memory array can include a string of memory cells that can be selectively coupled to a single bitline, where each of the memory cells in the string is further selectable via a wordline. A string of memory cells can be selectively coupled on its other side to a source line. The string can be coupled to (or isolated from) the bit line and the source line by operation of respective select transistors. To perform a read operation of a selected single-level memory cell in one example, the word line and therefore the control gate of the selected memory cell can be maintained at a low but positive voltage level while the word lines of unselected memory cells can be brought to a sufficiently high voltage to cause the unselected memory cells to conduct regardless of any charge that may be on the charge storage structures of the individual memory cells. If the selected memory cell has an uncharged charge storage structure it will conduct as a result of the low positive voltage level on the control gate, but if the charge storage structure has a negative charge it will raise the threshold voltage of the memory cell above the low positive voltage applied to the control gate such that the cell does not conduct. The data state of the memory cell's charge storage structure can therefore be determined by, for example, monitoring conductivity or current flow between the bitline and source line.

To program a selected memory cell in one example, the bitline and source line can be grounded via line select transistors coupling the string to a grounded bitline and source line. The gates of select transistors are therefore again coupled to a voltage source such that the transistors conduct. The control gates of the memory cells not being programmed can be brought to a sufficiently high voltage (e.g., ten volts) to inhibit inadvertent programming of those memory cells. The selected memory cell's control gate is coupled to a significantly higher voltage, such as 20 volts, such that electrons tunnel onto the charge storage structure.

Outside factors such as cosmic rays, program-induced disturbance, and read-induced disturbance can however cause the stored charge to change over time, resulting in variation in threshold voltage Vt of the programmed memory cells that can cause read errors or other performance issues.

Strings of memory cells can be organized in blocks, such that a block is the smallest erasable unit of flash memory. In an example, a block of NAND flash memory can include or use 64 separate word lines to provide 64 separately addressable physical pages of memory in the block, with each page capable of storing 4096 bytes of user data and 128 bytes of overhead data (sometimes referred to as spare bits), such as error correction code (ECC) data. ECC Data can be used to detect and/or correct some memory errors. In this example, the block can therefore store 256 kB of user data plus 8 kB of overhead data. A conventional flash memory device contains many such blocks, for example a 1024 block memory device providing 256 MB of user data storage.

Figure 2:
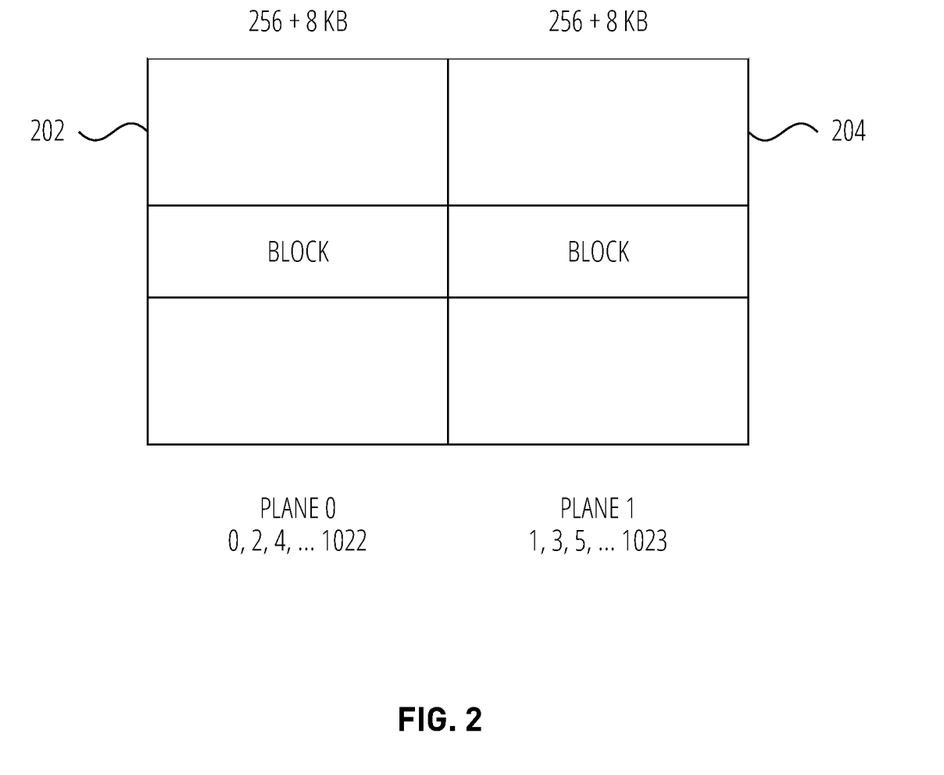
FIG. 2 illustrates generally an example of multiple planes of memory blocks in a string of memory cells.

FIG. 2 illustrates generally an example of multiple planes of memory blocks in a string of memory cells such as in a non-volatile memory device. In the example of FIG. 2, plane 0 202 contains even-numbered blocks of memory, and plane 1 204 contains odd-numbered blocks of memory, for a total of 1024 blocks. Dividing the memory into two or more planes can provide faster memory operation, but may restrict memory operations to reading, programming, and erasing even and odd-numbered planes at the same time. For example, an erase operation performed on block 0 of plane 0 202 could also include erasing block 1 of plane 1 204, and programming a page to block 1022 of plane 0 202 could result in also programming the corresponding page in block 1023 of plane 1 204.

Because the programming operation and read operation are similar in that they involve applying a voltage to the memory cells being written in a write operation or non-selected cells in a memory cell string in a read operation, multiple read, program, and/or erase operations can eventually affect the data state of a programmed memory cell. For example, some NAND flash memory can have the data states of its programmed memory cells corrupted after tens or hundreds of thousands of reads per page.

Although some errors can be corrected using the error correction data stored in the memory, it can be desirable to limit the number of read errors that occur to provide for more reliable and efficient memory operation, and to prevent multi-bit or other unrecoverable errors. For example, a memory block of 64 pages may have millions of read operations performed on the block to read the first 63 pages before the $64^{th}$ page is read, resulting in a significant chance of irrecoverable read errors on the $64^{th}$ page.

The present inventor has recognized that a solution to the memory error problem can include refreshing the memory (e.g., copying and reprogramming) over time to prevent corruption or loss of the stored data. Refreshing the memory can be performed as a result of factors such as the passage of time since programming, exceeding a read error threshold, or powering cycling of the memory device or memory controller (either directly, or indirectly such as by powering on a memory controller coupled to the memory device).

The present inventor has recognized that memory refresh can be initiated by a host device (sometimes referred to as host initiated refresh, or HIR) or can be initiated automatically by the memory device (sometimes referred to as automatically initiated refresh, or AIR). Data integrity problems can arise if a non-volatile memory is not refreshed, particularly if a memory is not refreshed preceding or following an extended period without external power. Without a real-time clock, such a non-volatile memory may be unaware of the duration of a particular period without power. The present inventor has recognized that a solution to the problem can include integration of HIR and AIR such that a refresh routine can be initiated in response to a command (e.g., indicating a power-up or power-down routine) or can be initiated automatically. In other words, the solution can include a memory device refresh mode that a user can access to initiate a memory device refresh routine separately from a refresh cadence provided by an AIR routine.

Some devices such as automobiles, portable game systems, smart phones, portable media devices, and other such devices are power cycled (i.e. powered on and powered off) relatively frequently, reducing the ability of the device to scan through all memory and manage potential read errors effectively. Some examples discussed herein use information about power cycling to manage errors in a nonvolatile memory, such as by using power cycles to trigger memory scan and refresh operations.

The impact of a single memory scan and refresh operation can be minimized in one example by scanning and refreshing on a block level, such that copying and reprogramming of perhaps megabytes of data stored in a single block can be completed in, for example, hundreds of milliseconds. In a further example, at least one different block can be scanned in response to each power cycle status change, ensuring that blocks of memory are scanned and refreshed regularly.

During device operation, scanning can continue on a block-by-block basis as a background routine, and any necessary refresh routines can be queued to be completed as part of the background task or as a part of a next power cycle. If power is lost, the device restart process in one example includes determining whether a block of memory from the device is already marked for refresh (e.g., such as when refreshing a block marked for refresh was not completed before power was lost). This method can be supplemented by a tracking mechanism in a further example, which tracks reads performed on each block and checks several pages of the block for errors periodically (e.g., every one thousand reads).

The identity of the current block being checked for errors can be stored in nonvolatile memory, such as in a register or in a portion of the memory array itself, and can be used to ensure that block checks triggered by power cycling or performed as a background task proceed through all of the memory rather than restarting at the same block for each power cycle. Refreshing can be further tracked across power cycling by marking blocks for refresh, such that queued or incomplete block refreshes can be completed as part of a power on sequence or during device operation after a power on sequence completes.

Figure 3:
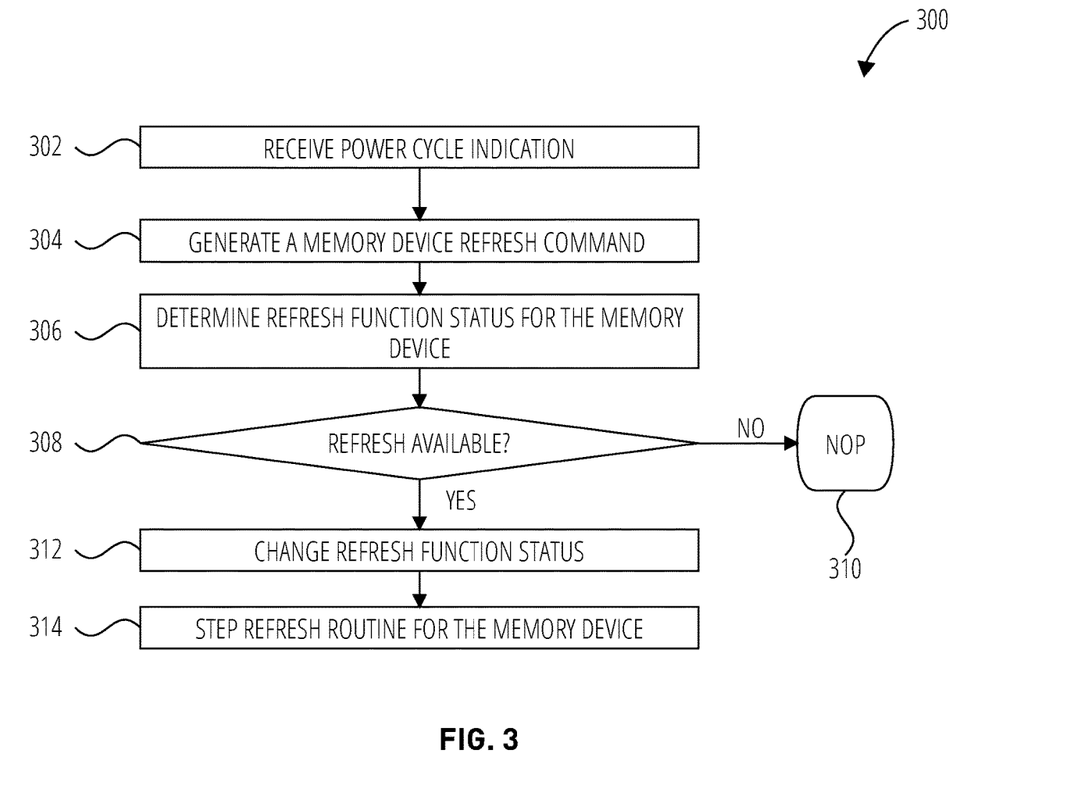
FIG. 3 illustrates generally an example of a first refresh routine.

FIG. 3 illustrates generally an example of a first refresh routine 300. The first refresh routine 300 can begin at block 302 with receiving a power cycle indication, such as from the controller 116 of the memory system 114, or from the power subsystem 110 of the host device 102, or from a different source. In an example, the power cycle indication includes information about an actual or expected change in a power signal that is provided to the memory system 114 or to a device in the memory system 114. The information can indicate power to the memory system 114, or to a device in the memory system 114, will be switched on or off.

At block 304, in response to the power cycle indication, the first refresh routine 300 can include generating a memory device refresh command. The refresh command can be generated by the host device 102, by the controller 116 of the memory system 114, or by another system or device that comprises the computing system 100. In an example, the refresh command specifies which of multiple memory devices in the memory system 114 to refresh, or specifies which of multiple blocks or cells of a memory device to refresh.

At block 306, the first refresh routine 300 can include determining a refresh function status for the memory device, memory block, or memory cells indicated for refresh by the refresh command. The refresh function status includes information about whether a refresh routine is already underway. At decision block 308, the first refresh routine 300 includes determining whether a refresh routine is available based on the refresh function status. The refresh routine may be unavailable, for example, if a refresh routine is already underway. For example, if a host-initiated refresh command is received while an automatically-initiated refresh routine is underway, then the refresh function status can indicate that refresh is unavailable. If the refresh routine is unavailable, then the first refresh routine 300 can continue at done block 310. At done block 310, the first refresh routine 300 can terminate or end. Responsive to the indication that refresh is unavailable, the memory system 114 can provide an indication to the host device 102 that a refresh routine is unavailable or is already underway.

If, however, the refresh routine is available, then the first refresh routine 300 can continue at block 312. At block 312, the first refresh routine 300 includes changing a value of the refresh function status. The value can be changed to indicate that a refresh routine is underway at the memory device. Subsequently, the first refresh routine 300 can continue at block 314 with stepping or incrementing a refresh routine for the particular memory device, memory block, or memory cells indicated by the refresh command from block 304. In an example, stepping the refresh routine includes reading information from a log file to determine a next memory block, or next device, to refresh. When the refresh routine is completed, the refresh function status can be updated again to indicate availability of further refresh operations. The log file can be updated to include information about which memory device or portion thereof was refreshed.

Figure 4:
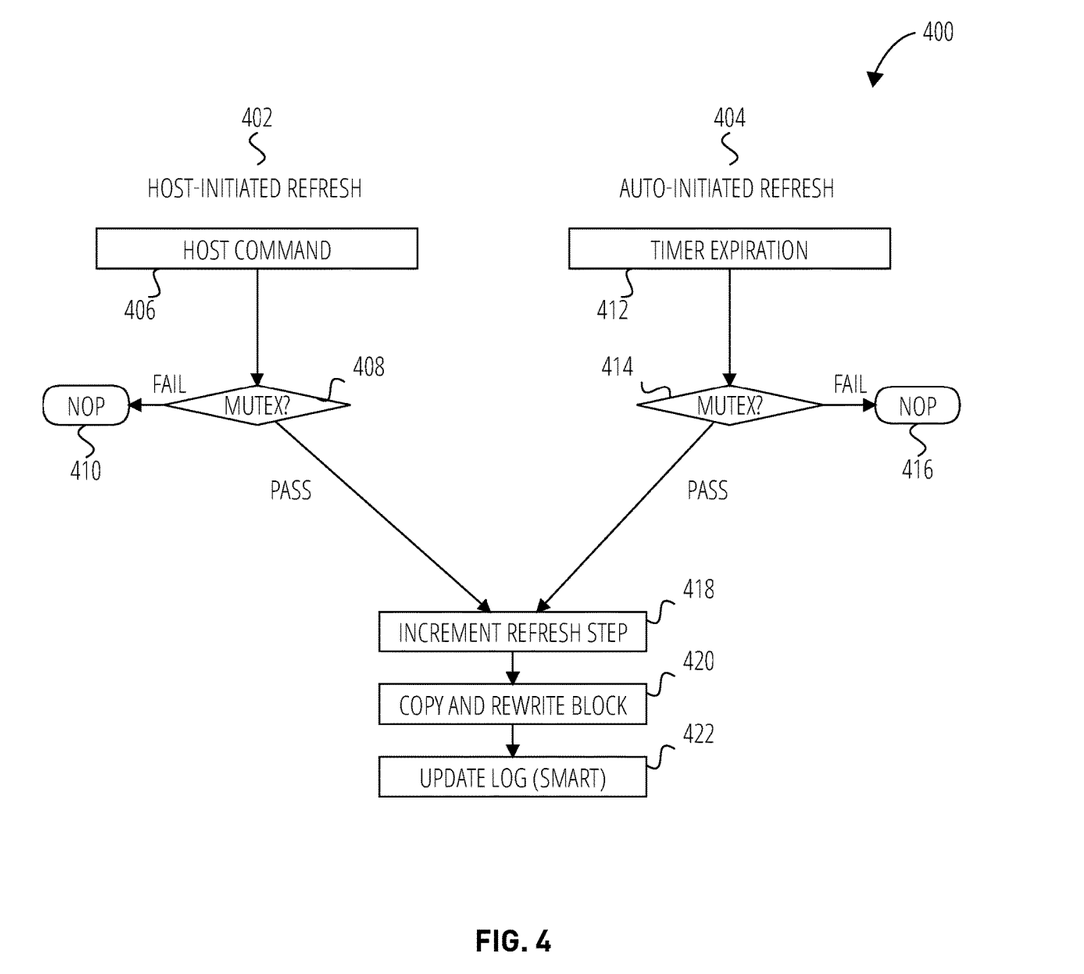
FIG. 4 illustrates generally an example of a second refresh routine.

FIG. 4 illustrates generally an example of a second refresh routine 400. The second refresh routine 400 shows how a mutex function can be used to help control refresh initiation from multiple refresh command sources. For example, the second refresh routine 400 illustrates generally a host-initiated refresh 402 and an automatically-initiated refresh 404.

The host-initiated refresh 402 can include, at block 406, generating a host command to initiate a refresh routine. For example, block 406 can include using the host device 102 to generate a refresh command for a memory device in response to, e.g., information from the power subsystem 110, information from the host timer circuit 108, or other instructions from the host device 102 or from another component of the computing system 100.

The second refresh routine 400 can continue the host-initiated refresh 402 by calling a mutex function at decision block 408. A mutex function is a software-based lock that can be set to control access to a shared resource or routine, such as a refresh routine. When a mutex lock is set by one thread or process to protect a particular resource, a different thread or process is prohibited from accessing the protected resource until the mutex lock is released. If the different thread or process calls the mutex function and is unsuccessful, then various responsive actions can be taken. For example, the call can be pended and retried or the call can be ignored.

In response to the host command from block 406, the decision block 408 can determine whether a mutex lock is set and therefore controlling access to a refresh routine for a particular memory device. If the mutex lock is set, then the refresh routine for the particular memory device is unavailable. The refresh routine can be unavailable, for example, if refresh is already underway (e.g., due to an earlier host command or an automatically-initiated refresh command). If the mutex lock is set at decision block 408, then the second refresh routine 400 can continue at done block 410 with no operation, and the routine can terminate. If the mutex lock is not set at decision block 408, then the second refresh routine 400 can continue at block 418.

The automatically-initiated refresh 404 can include, at block 412, determining expiration of a time interval measured by, e.g., the memory timer circuit 126 of the memory system 114. For example, block 412 can include using the controller 116 of the memory system 114 to generate a refresh command for a memory device in response to, e.g., information from the memory timer circuit 126 about an elapsed time interval. The duration of the interval can be specified by a user or a different component of the computing system 100.

The second refresh routine 400 can continue the automatically-initiated refresh 404 by calling a mutex function at decision block 414. The mutex function called at decision block 414 can be the same resource-protecting function that is called at decision block 408. In response to the command generated in response to the timer expiration at block 412, the decision block 414 can determine whether the mutex lock is set and therefore controlling access to a refresh routine for a particular memory device. The refresh routine can be unavailable, for example, if refresh is already underway (e.g., due to an earlier host command). If the mutex lock is set at decision block 414, then the second refresh routine 400 can continue at done block 416 with no operation, and the routine can terminate. If the mutex lock is not set at decision block 414, then the second refresh routine 400 can continue at block 418. In an example, continuing from decision block 408 or decision block 414 to block 418 includes setting the mutex lock to indicate a refresh routine is underway. The mutex lock can be cleared, for example, in response to an instruction indicating completion of a refresh routine, in response to expiration of a time interval, or in response to another command or interrupt.

At block 418, the second refresh routine 400 can include incrementing a refresh step in a refresh routine for the memory device which is to be refreshed. In an example, incrementing the refresh step includes reading information from a log file to determine a present or next memory block or device to refresh.

At block 420, the second refresh routine 400 can include performing the refresh routine, for example, by copying one memory block and writing the copied memory block to a new location in the same memory device or a different device. At block 422, the second refresh routine 400 includes updating the log file to include information about which memory block or blocks were refreshed.

Figure 5:
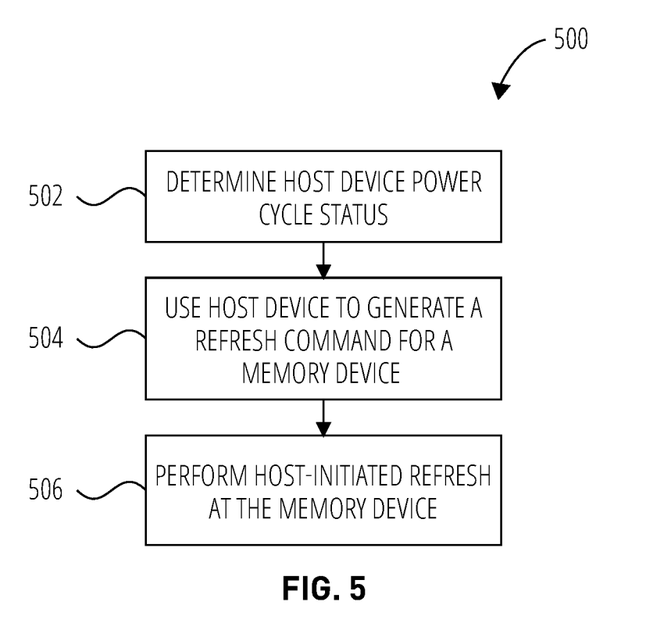
FIG. 5 illustrates generally an example of a portion of a host-initiated refresh method.

FIG. 5 illustrates generally an example of a portion of a host-initiated refresh method 500. At block 502, the host-initiated refresh method 500 includes determining a power cycle status of a host device, such as the host device 102 of the computing system 100. Determining the power cycle status at block 502 can include or use information from or about the power subsystem 110. In an example, the power cycle status indicates an actual or expected change in a power signal that is provided to the memory system 114 or to a device in the memory system 114. The information can indicate power to the memory system 114, or to a device in the memory system 114, will be switched on or off. For example, determining a power cycle status can include determining a user is about to remove a battery from a system, such as an automobile, or determining a user is about to power-down a device for an extended or unusually long period of time.

In response to the determined power cycle status, the host-initiated refresh method 500 can continue at block 504 with using the host device 102 to generate a refresh command for a memory device. The refresh command can indicate a global refresh command to refresh all memory blocks in the memory system 114, or the command can indicate a particular block or group of blocks in the memory system 114 to refresh. In an example, the refresh command can include instructions for the controller 116 to consult a refresh log and conditionally refresh one or more memory blocks based on the refresh status of the blocks. At block 506, the host-initiated refresh method 500 can include performing the host-initiated refresh at the one or more blocks of the memory device. For example, block 506 can include or use the host-initiated refresh 402 from the example of FIG. 4.

Figure 6:
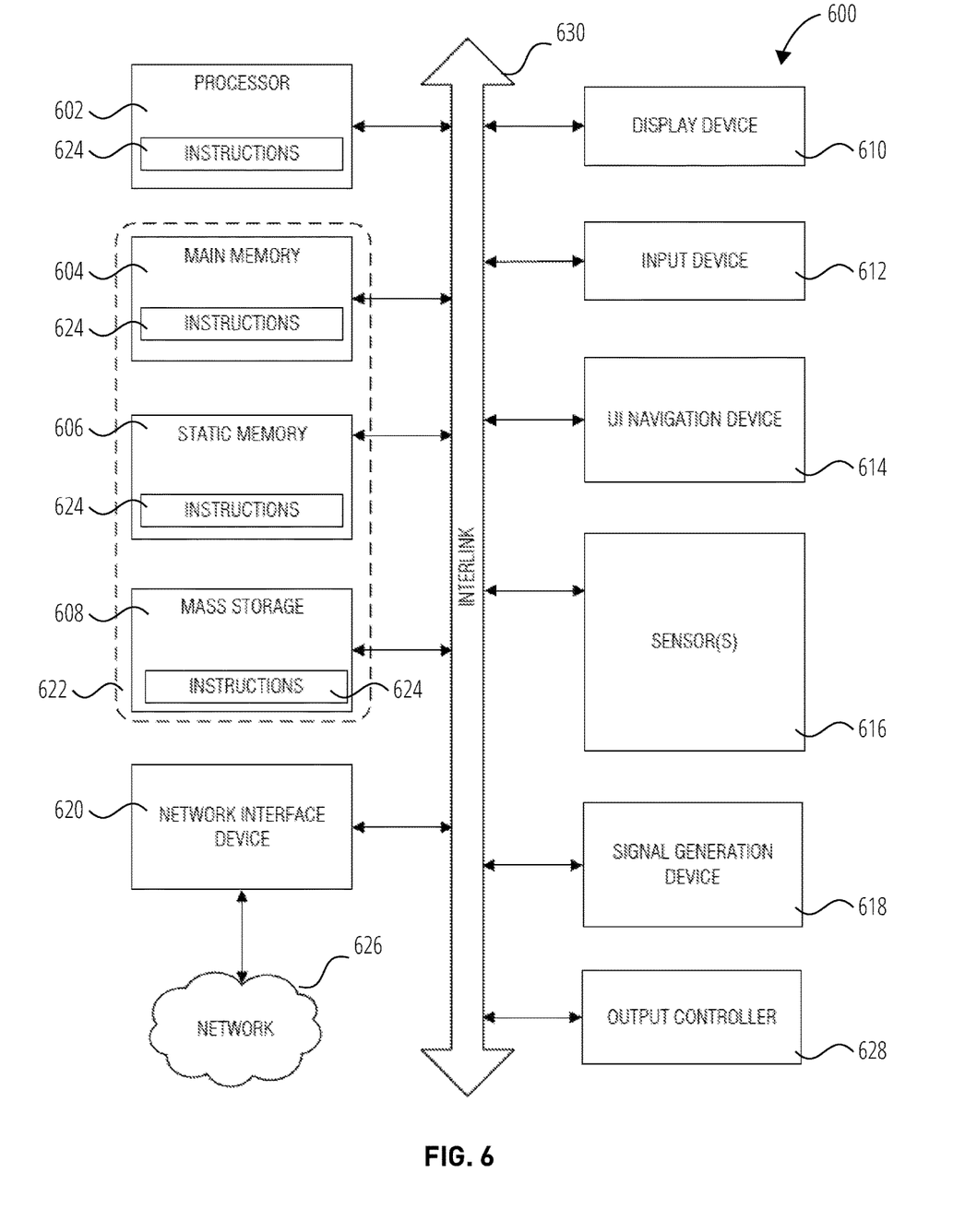
FIG. 6 illustrates a block diagram of an example machine with which, in which, or by which any one or more of the techniques discussed herein can be implemented.

The refresh systems and methods described herein in some embodiments are managed by a memory controller that is integral to a memory device, such as one that forms a part of a flash memory card, and in other embodiments can be implemented external to a memory device, such that the methods described above can be employed with off-the-shelf non-volatile memory devices. FIG. 6 illustrates a block diagram of an example machine 600 with which, in which, or by which any one or more of the techniques (e.g., methodologies) discussed herein can be implemented. Examples, as described herein, can include, or can operate by, logic or a number of components, or mechanisms in the machine 600. Circuitry (e.g., processing circuitry) is a collection of circuits implemented in tangible entities of the machine 600 that include hardware (e.g., simple circuits, gates, logic, etc.). Circuitry membership (e.g., as belonging to a host-side device or process, or to an accelerator-side device or process) can be flexible over time. Circuitries include members that can, alone or in combination, perform specified operations when operating. In an example, hardware of the circuitry can be immutably designed to carry out a specific operation (e.g., hardwired) for example using the computing system 100 or using a specific command execution unit thereof. In an example, the hardware of the circuitry can include variably connected physical components (e.g., command execution units, transistors, simple circuits, etc.) including a machine readable medium physically modified (e.g., magnetically, electrically, moveable placement of invariant massed particles, etc.) to encode instructions of the specific operation, such as a refresh operation and a mutex function that controls access to the refresh operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware with the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

In alternative embodiments, the machine 600 can operate as a standalone device or can be connected (e.g., networked) to other machines. In a networked deployment, the machine 600 can operate in the capacity of a server machine, a client machine, or both in server-client network environments. In an example, the machine 600 can act as a peer machine in peer-to-peer (P2P) (or other distributed) network environment. The machine 600 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Any one or more of the components of the machine 600 can include or use one or more instances of the host device 102 or the memory system 114 or other component in or appurtenant to the computing system 100. The machine 600 (e.g., computer system) can include a hardware processor 602 (e.g., the processor 106, the controller 116, a central processing unit (CPU), a graphics processing unit (GPU), a hardware processor core, or any combination thereof), a main memory 604, a static memory 606 (e.g., memory or storage for firmware, microcode, a basic-input-output (BIOS), unified extensible firmware interface (UEFI), etc.), and mass storage device 608 or memory die stack, hard drives, tape drives, flash storage, or other block devices) some or all of which can communicate with each other via an interlink 630 (e.g., bus). The machine 600 can further include a display device 610, an alphanumeric input device 612 (e.g., a keyboard), and a user interface (UI) Navigation device 614 (e.g., a mouse). In an example, the display device 610, the input device 612, and the UI navigation device 614 can be a touch screen display. The machine 600 can additionally include a mass storage device 608 (e.g., a drive unit), a signal generation device 618 (e.g., a speaker), a network interface device 620, and one or more sensor(s) 616, such as a global positioning system (GPS) sensor, compass, accelerometer, or other sensor. The machine 600 can include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 602, the main memory 604, the static memory 606, or the mass storage device 608 can be, or include, a machine-readable media 622 on which is stored one or more sets of data structures or instructions 624 (e.g., software) embodying or used by any one or more of the techniques or functions described herein. The instructions 624 can also reside, completely or at least partially, within any of registers of the hardware processor 602, the main memory 604, the static memory 606, or the mass storage device 608 during execution thereof by the machine 600. In an example, one or any combination of the hardware processor 602, the main memory 604, the static memory 606, or the mass storage device 608 can constitute the machine-readable media 622. While the machine-readable media 622 is illustrated as a single medium, the term "machine-readable medium" can include a single medium or multiple media (e.g., a centralized or distributed database, or associated caches and servers) configured to store the one or more instructions 624.

The term "machine readable medium" can include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on the machine-readable media 622 can be representative of the instructions 624, such as instructions 624 themselves or a format from which the instructions 624 can be derived. This format from which the instructions 624 can be derived can include source code, encoded instructions (e.g., in compressed or encrypted form), packaged instructions (e.g., split into multiple packages), or the like. The information representative of the instructions 624 in the machine-readable media 622 can be processed by processing circuitry into the instructions to implement any of the operations discussed herein. For example, deriving the instructions 624 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 624.

In an example, the derivation of the instructions 624 can include assembly, compilation, or interpretation of the information (e.g., by the processing circuitry) to create the instructions 624 from some intermediate or preprocessed format provided by the machine-readable media 622. The information, when provided in multiple parts, can be combined, unpacked, and modified to create the instructions 624. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 624 can be further transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 620 can include one or more physical jacks (e.g., Ethernet, coaxial, or phone jacks) or one or more antennas to connect to the network 626. In an example, the network interface device 620 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software. A transmission medium is a machine readable medium.

To better illustrate the methods and apparatuses described herein, such as can be used to initiate or control a refresh routine for a non-volatile memory, a non-limiting set of Example embodiments are set forth below as numerically identified Examples.

Example 1 is a system that includes an array of non-volatile memory cells, and a memory controller configured to refresh at least a portion of the memory cells in response to a refresh command. The refresh command can be based on an automatic refresh cadence or a host command.

In Example 2, the subject matter of Example 1 can optionally include the memory controller configured to refresh the portion of the memory cells in response to checking the memory cells for one or more errors.

In Example 3, the subject matter of Example 2 can optionally include the one or more errors include a detected change in an operating margin of a stored cell voltage.

In Example 4, the subject matter of Examples 1-3 can optionally include the memory controller configured to refresh the portion of the memory cells by copying at least one memory block to a known-good memory block.

In Example 5, the subject matter of Examples 1-4 can optionally include the memory controller configured to exclusively allow the refresh command to be based on one or the other of the host command and the automatic refresh cadence at a particular time.

In Example 6, the subject matter of Examples 1-5 can optionally include the memory controller configured to use a mutex function to control an influence of the automatic refresh cadence and the host command on the refresh command.

In Example 7, the subject matter of Examples 1-6 can optionally include or use a timer circuit, wherein the automatic refresh cadence is based on an interval or period measured by the timer circuit.

In Example 8, the subject matter of Example 7 can optionally include the timer circuit configured to receive a timer control signal that indicates the interval or period.

In Example 9, the subject matter of Examples 1-8 can optionally include, in response to the refresh command, the memory controller is configured to increment a refresh scan by one block.

In Example 10, the subject matter of Examples 1-9 can optionally include the refresh command is based on an error correction code (ECC) value for the memory cells.

In Example 11, the subject matter of Examples 1-10 can optionally include the memory controller configured to maintain a log (e.g., a SMART log) indicating a refresh status for the memory cells.

In Example 12, the subject matter of Examples 1-11 can optionally include the host command is based on a power-up or power-down of the memory controller.

In Example 13, the subject matter of Examples 1-12 can optionally include a host device configured to provide the host command to the memory controller based on a power cycle status of the host device.

Example 14 is a method that includes receiving a first refresh command to refresh a portion of a non-volatile memory device, determining a refresh function status for the memory device, and responsive to determining the refresh function status indicates refresh is available, changing a value of the refresh function status and initiating a refresh routine for a portion of the memory device. In Example 14, responsive to determining the refresh function status indicates refresh is unavailable, the method can include providing to a host device an indication that the refresh routine is underway. In Example 14, the first refresh command can be based on a host command from the host device or based on an automatic refresh cadence that is enforced by or for the memory device.

In Example 15, the subject matter of Example 14 can optionally include determining the refresh function status indicates refresh is available, and changing the value of the refresh function status to indicate refresh is temporarily unavailable. In Example 15, initiating the refresh routine can include incrementing a scan of the memory device.

In Example 16, the subject matter of Example 15 can optionally include updating a log file to indicate a refresh status for the memory device.

In Example 17, the subject matter of Examples 14-16 can optionally include determining the refresh function status includes calling a mutex function and, in response, receiving the indication that the refresh routine is underway or receiving a refresh continue response when refresh is available.

In Example 18, the subject matter of Examples 14-17 can optionally include using a timer circuit to determine the automatic refresh cadence.

In Example 19, the subject matter of Examples 14-18 can optionally include the first refresh command is based on a power cycle status of the memory device.

In Example 20, the subject matter of Examples 14-19 can optionally include receiving a device power command that indicates power to the memory device will be switched on or off and, in response, generating the first refresh command.

Example 21 is a memory device controller for a non-volatile memory device, and the memory device controller is configured to allow exclusive access to initiate or increment a refresh routine based on an earlier-received one of a refresh command from a host device or an interval-triggered refresh command from the controller. In an example, a later-received one of the refresh command from the other of the host device and the interval-triggered refresh command can be ignored or pended.

In Example 22, the subject matter of Example 21 can optionally include the memory device controller configured to lock out access to the refresh routine from a later-received one of the refresh command from the host device or the interval-triggered refresh command from the controller.

In Example 23, the subject matter of Example 22 can optionally include the memory device controller configured to release a lock on access to the refresh routine upon completion of a block refresh routine for a memory block of the memory device.

In Example 24, the subject matter of Examples 21-23 can optionally include the refresh command from the host device is based on a power cycle status of the host device.

In Example 25, the subject matter of Examples 21-24 can optionally include the memory device controller is configured to check the memory device for errors as a background routine while the memory device is available for other access operations.

Example 26 is at least one machine-readable medium including instructions that, when executed by processing circuitry, cause the processing circuitry to perform operations to implement of any of Examples 1-25.

Example 27 is an apparatus comprising means to implement of any of Examples 1-25.

Example 28 is a system to implement of any of Examples 1-25.

Example 29 is a method to implement of any of Examples 1-25.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
an array of non-volatile memory cells; and
a memory controller configured to refresh at least a portion of the non-volatile memory cells in response to a refresh command based on a refresh routine, wherein the refresh command is based on an automatic refresh cadence or a host command, and wherein the memory controller is configured to use a mutex function to control access to the refresh routine.

2. The system of claim 1, wherein the memory controller is configured to refresh the portion of the non-volatile memory cells in response to checking the non-volatile memory cells for one or more errors.

3. The system of claim 2, wherein the one or more errors include a change in an operating margin of a stored cell voltage.

4. The system of claim 1, wherein the memory controller is configured to refresh the portion of the non-volatile memory cells by copying at least one memory block to a known-good memory block.

5. The system of claim 1, wherein the memory controller is configured to exclusively allow the refresh command to be based on one of the host command or the automatic refresh cadence, while disallowing a competing refresh command from the other of the host command or the automatic refresh cadence.

6. The system of claim 1, comprising a timer circuit, wherein the automatic refresh cadence is based on an interval or period measured by the timer circuit.

7. The system of claim 6, wherein the timer circuit is configured to receive a timer control signal that indicates the interval or period.

8. The system of claim 1, wherein in response to the refresh command, the memory controller is configured to increment a refresh scan by one block.

9. The system of claim 1, wherein the refresh command is based on an error correction code (ECC) value for the non-volatile memory cells.

10. The system of claim 1, wherein the memory controller is configured to maintain a log indicating a refresh status for the non-volatile memory cells.

11. The system of claim 1, wherein the host command is based on a power-up or power-down of the memory controller.

12. The system of claim 1, comprising a host device configured to provide the host command to the memory controller based on a power cycle status of the host device.

13. The system of claim 1, wherein the memory controller is configured to use the mutex function to control access to the refresh routine by:
  determining whether a mutex lock is set to inhibit access to the refresh routine;
  in response to the mutex lock being unset, initiating the refresh routine; and
  in response to the mutex lock being set to prohibit access to the refresh routine:
    disallowing refresh;
    determining whether the mutex lock can be cleared; and
    responsive to determining the mutex lock can be cleared, clearing the mutex lock and initiating the refresh routine.

14. A method comprising:
  receiving a first refresh command to refresh a portion of a non-volatile memory device;
  determining a refresh function status for the non-volatile memory device;
  responsive to determining the refresh function status indicates refresh is available, changing a value of the refresh function status and initiating a refresh routine for a portion of the non-volatile memory device; and
  responsive to determining the refresh function status indicates refresh is unavailable, providing to a host device an indication that the refresh routine is underway;
  wherein the first refresh command is based on a host command from the host device or is based on an automatic refresh cadence for the non-volatile memory device.

15. The method of claim 14, further comprising:
  determining the refresh function status indicates refresh is available; and
  changing the value of the refresh function status to indicate refresh is temporarily unavailable;
  wherein initiating the refresh routine includes incrementing a scan of the non-volatile memory device.

16. The method of claim 15, further comprising updating a log file to indicate a refresh status for the non-volatile memory device.

17. The method of claim 14, wherein determining the refresh function status includes calling a mutex function and, in response, receiving the indication that the refresh routine is underway or receiving a refresh continue response when refresh is available.

18. The method of claim 14, further comprising using a timer circuit to determine the automatic refresh cadence.

19. The method of claim 14, wherein the first refresh command is based on a power cycle status of the non-volatile memory device.

20. The method of claim 14, comprising:
  receiving a device power command that indicates power to the non-volatile memory device will be switched on or off and, in response, generating the first refresh command.

21. A memory device controller for a non-volatile memory device, the memory device controller configured to allow exclusive access to initiate or increment a refresh routine based on an earlier-received one of a refresh command from a host device or an interval-triggered refresh command from the memory device controller, wherein the memory device controller is configured to lock out access to the refresh routine from a later-received one of the refresh command from the host device or the interval-triggered refresh command from the controller, and wherein the memory device controller is configured to release a lock on access to the refresh routine upon completion of a block refresh routine for a memory block of the memory device.

22. The memory device controller of claim 21, wherein the refresh command from the host device is based on a power cycle status of the host device.

23. The memory device controller of claim 21, wherein the memory device controller is configured to check the non-volatile memory device for errors as a background routine while the non-volatile memory device is available for other access operations.

* * * * *